(12) United States Patent
Suzuki

(10) Patent No.: US 7,992,108 B2
(45) Date of Patent: Aug. 2, 2011

(54) IMPURITY CONCENTRATION DISTRIBUTION PREDICTING METHOD AND PROGRAM FOR DECIDING IMPURITY CONCENTRATION DISTRIBUTION

(75) Inventor: Kunihiro Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 595 days.

(21) Appl. No.: 11/964,300

(22) Filed: Dec. 26, 2007

(65) Prior Publication Data

US 2008/0109768 A1    May 8, 2008

Related U.S. Application Data

(63) Continuation of application No. PCT/JP2005/012138, filed on Jun. 30, 2005.

(51) Int. Cl.
 *G06F 17/50*    (2006.01)
(52) U.S. Cl. ............... 716/51; 716/50; 716/54; 716/55; 716/56; 257/101; 257/219; 257/335; 257/655; 438/302
(58) Field of Classification Search .............. 716/19–21, 716/50–56; 257/655, E21.057, E21.059, 257/101, 219, 335; 438/302–306
See application file for complete search history.

(56) References Cited

U.S. PATENT DOCUMENTS 6,905,893 B1 *  6/2005  Narayanan et al. ............. 438/14
2004/0238883 A1 * 12/2004  Nishinohara et al. ......... 257/330

FOREIGN PATENT DOCUMENTS

| JP | 2000-138178 A | 5/2000 |
|---|---|---|
| JP | 2003-163173 A | 6/2003 |

OTHER PUBLICATIONS

K. Suzuki et al.; "Estimating Lateral Straggling of Impurity Profiles of Ions Implanted Into Crystalline Silicon"; IEEE Transcation on electron Devices, vol. 48, No. 12, pp. 2803-2807, Dec. 2001, cited in the ISR.
K. Suzuki et al.; "Analytical expression for ion-implanted impurity concentration profiles"; Solid-State Electronic, vol. 44, pagtes 22-53-2257. 2000.
International Search Report of PCT/JP2005/012138, date of mailing Oct. 18, 2005.
Notification of Transmittal of Translation of the International Preliminary Report on Patentability of International Application No. PCT/JP 2005/012138, with Form PCT/IB/373 and Form PCT/ISA/237, Mail Jan. 9, 2008.

* cited by examiner

*Primary Examiner* — Paul Dinh
*Assistant Examiner* — Nha T Nguyen
(74) *Attorney, Agent, or Firm* — Fujitsu Patent Center

(57) ABSTRACT

First and second evaluation substrates are prepared, a direction perpendicular to a surface of the first evaluation substrate being defined by first indices, and the direction defined by the first indices being inclined from a normal direction of a surface of the second evaluation substrate. Ion implantation is performed for the first evaluation substrate in a vertical direction. Ion implantation is performed for the second evaluation substrate by using an ion beam parallel to the direction defined by the first indices. Impurity concentration distributions in a depth direction of the first and second evaluation substrates are measured. A first impurity concentration distribution on an extension line of an ion beam and a second impurity concentration distribution in a direction perpendicular to the extension line are predicted from the measured impurity concentration distributions of the first and second evaluation substrates.

12 Claims, 7 Drawing Sheets

FIG. 5

| Acceleration Energy (keV) | Rp (nm) | ΔRp (nm) | γ | β | Rp2 (nm) | L (nm) | α | ΔRpt0 (nm) | $m_f$ | $m_{ba}$ | $m_{bc}$ | $\Phi_{chan}$ ($10^{13}$cm$^{-2}$) |
|---|---|---|---|---|---|---|---|---|---|---|---|---|
| 20 | 98 | 38 | −0.3 | 3.2 | 176 | 175 | 5 | 34 | −0.1 | −0.1 | −0.2 | 5.57 |
| 40 | 190 | 58 | | | 320 | 196 | | 51 | | | | 3.87 |
| 80 | 316 | 83 | | | 482 | 260 | | 77 | | | | 4.07 |
| 160 | 550 | 120 | | | 770 | 270 | | 96 | | | | 3.33 |

IMPURITY CONCENTRATION DISTRIBUTION PREDICTING METHOD AND PROGRAM FOR DECIDING IMPURITY CONCENTRATION DISTRIBUTION

CROSS REFERENCE TO RELATED APPLICATION

This application is based on PCT/JP2005/012138 filed on Jun. 30, 2005, the entire contents of which are incorporated herein by reference.

TECHNICAL FIELD

The present invention relates to an impurity concentration distribution predicting method and a program for deciding an impurity concentration distribution.

BACKGROUND

In ion implantation for forming source and drain regions of a MOS transistor, implanted impurities collide with atoms constituting the substrate, diffuse in a lateral direction and distribute below a gate electrode. As the gate length becomes short, an impurity concentration distribution in a lateral direction influences the device performance greatly. It is therefore important to know an impurity concentration distribution in a lateral direction in the region below a gate electrode. It is, however, difficult to directly measure an impurity concentration distribution in a lateral direction.

A method of evaluating an impurity concentration distribution in a lateral direction is described (for example, refer to the paper "Estimating lateral straggling of impurity profiles of ions implanted into crystalline silicon" by K. Suzuki, R. Sudo, and M. Nagase, IEEE Trans. Electron Devices, ED-48, pp. 2803-2807, 2001).

An xy orthogonal coordinate system and an st orthogonal coordinate system are defined as shown in FIG. 1. The origins of both the systems are coincident, and positioned on the surface of a semiconductor substrate. A y-axis is parallel to a propagation direction of an ion beam of ion implantation, and an s-axis is perpendicular to the surface of the semiconductor substrate. Both the positive sense of each of the y-axis and s-axis looks toward the inside of the substrate. When the angle of incidence of the ion beam is $\theta$, an angle between the y-axis and s-axis is equal to $\theta$.

An x-axis and a t-axis are disposed on a plane on which the y-axis and s-axis are disposed. The positive sense of the x-axis looks toward the inside of the substrate. The t-axis is contained in the surface of the semiconductor substrate, and the positive sense of the t-axis looks toward upstream of an ion beam.

An impurity concentration distribution formed by an ion beam incident upon the origin is defined by $D(x, y)$. An impurity concentration distribution formed by an ion beam incident upon a position $x=u$ is expressed by $D(x-u, y+u\times\tan\theta)$.

An impurity concentration distribution $dN(x, y)$ at a coordinate point $(x, y)$ formed by an ion beam incident upon a position between $x=u$ and $x=u+du$ is given by the following formula (1):

$$dN(x,y) = D(x-u, y+u\tan\theta)du$$

If ion implantation is performed by assuming that the surface area of a semiconductor substrate is infinite and the whole area in a direction of the x-axis is scanned with an ion beam, an impurity concentration $N(x, y)$ at the coordinate point $(x, y)$ is given by the following formula (2):

$$N(x, y) = \int_{-\infty}^{\infty} D(x-u, y+u\tan\theta)du$$

The coordinates $(x, y)$ and $(s, t)$ have the relation given by the following formulas (3):

$$x = t\cos\theta + s\sin\theta$$

$$y = s\cos\theta - t\sin\theta$$

The impurity concentration $N(s, t)$ at the coordinate point $(s, t)$ is therefore given by the following formula (4):

$$N(s, t) = \int_{-\infty}^{\infty} D(t\cos\theta + s\sin\theta - u, s\cos\theta - t\sin\theta + u\tan\theta)du$$

Since the impurity concentration is supposed not to depend on t, a dummy variable $\underline{k}$ given by the following formula (5) is defined in order to eliminate the variable $\underline{t}$ from the formula (4):

$$k = \frac{-t\sin\theta + u\tan\theta}{\tan\theta}$$

The formula (4) is rewritten by using the variable $\underline{k}$ to obtain the following formula (6):

$$N(s) = \int_{-\infty}^{\infty} D(s\sin\theta - u, s\cos\theta + u\tan\theta)du$$

If $y<0$, $D(x, y)=0$. It is therefore sufficient that integration in the formula (6) is performed only in the region given by the following formula (7):

$$s\cos\theta + u\tan\theta \geq 0$$

Therefore, a lower limit value of the integration range of the formula (6) may be set to:

$$-s\left(\frac{\cos\theta}{\tan\theta}\right)$$

Consider now the case in which an impurity concentration distribution $D(x, y)$ is expressed by a product of a function $n(y)$ dependent upon only a depth direction $\underline{y}$ and a function $g(x, y)$ dependent upon also a lateral direction $\underline{x}$. It is assumed that the functions $n(y)$ and $g(x, y)$ are normalized by a dose. A well-known dual Pearson IV distribution may be adopted as a normalized impurity concentration distribution $n(y)$ in a depth direction. It is also possible to adopt a distribution described in the paper "Analytical expression for ion-implanted impurity concentration profiles", by K. Suzuki and R. Sudo, Solid-State Electronics, vol. 44, pp. 2253-2257, 2001. A normalized impurity concentration distribution $g(x, y)$ in a lateral direction may adopt a function which, for example, has a normal distribution in respect to $\underline{x}$, with its standard deviation being dependent upon y.

As a dose is represented by $\Phi$, the formula (6) can be expressed in the following formula (9):

$$N(s) = \Phi \int_{-\infty}^{\infty} n(s\cos\theta + u\tan\theta)g(s\sin\theta - u, s\cos\theta + u\tan\theta)\,du$$

From this formula (9), an impurity concentration distribution $N_0(s)$ at an ion beam incidence angle $\theta$ of $0°$ is given by the following formula (10):

$$N_0(s) = \Phi \cdot n(s) \int_{-\infty}^{\infty} g(-u, s)\,du = \Phi \cdot n(s)$$

An impurity concentration distribution $N(s)$ can be measured actually by secondary ion mass spectroscopy (SIMS) or the like. It is therefore possible to determine a normalized impurity concentration distribution $n(s)$ in a depth direction.

By setting an ion beam incidence angle to an angle other than $0°$ to conduct ion implantation in an oblique direction, the impurity concentration distribution $N(s)$ in a depth direction is actually measured by SIMS or the like. Since the shape of the normalized impurity concentration distribution $n(s)$ in a depth direction is determined through measurement of an impurity concentration distribution by ion implantation in a vertical direction, a normalized impurity concentration distribution $g(x, y)$ in a lateral direction can be decided in accordance with the formula (9) and the actually measured impurity concentration distribution $N(s)$.

Spread information of impurities in a lateral direction can be obtained by measuring only the impurity concentration distribution in a depth direction, without directly measuring an impurity concentration distribution in a lateral direction.

The method described above can be adopted only when satisfying the prerequisite that an impurity concentration distribution $n(y)$ in a depth direction by ion implantation in a vertical direction, i.e., along an extension line of an ion beam, is equal to an impurity concentration distribution $n(y)$ on an extension line of an ion beam by ion implantation in an oblique direction.

If a silicon single crystal substrate having a (1 0 0) plane as a principal surface (hereinafter called a (1 0 0) substrate) is used, an ion implantation method at an ion beam incidence angle of $7°$ is adopted in some cases to suppress the channeling phenomenon. The channeling phenomenon can be suppressed even at an ion beam incidence angle of, e.g., about $25°$. It is considered that the normalized impurity concentration distribution $n(y)$ on the extension line of an ion beam at an incidence angle of $25°$ is approximated to the normalized impurity concentration distribution $n(y)$ along the extension line of an ion beam at an incidence angle of $7°$.

At the ion beam incidence angle of $7°$, a shift between a propagation direction of an ion beam and a substrate depth direction is extremely small. It is therefore possible to estimate a normalized impurity concentration distribution $n(y)$ on an extension line of an ion beam, from an impurity concentration distribution $N(s)$ in a depth direction at an incidence angle of $7°$.

It is therefore possible to evaluate a spread in a lateral direction by actually measuring an impurity concentration distribution in a depth direction at an incidence angle of $7°$ and an impurity concentration distribution in a depth direction at an incidence angle of $25°$. Namely, it is possible to decide a normalized impurity concentration distribution $g(x, y)$ in a lateral direction.

However, if ion implantation into a (1 0 0) substrate is performed at an incidence angle of $0°$, the channeling phenomenon is likely to occur. An incidence angle condition does not exist which causes the channeling phenomenon to the same extent as that of the incidence angle of $0°$. The method described above cannot evaluate an impurity spread in a lateral direction when ion implantation into a (1 0 0) substrate is performed at an incidence angle of $0°$.

SUMMARY

According to one aspect of the present invention, there is provided a method of predicting an impurity concentration distribution having: (a) preparing a first evaluation substrate in which a direction perpendicular to a surface of the first evaluation substrate or a direction shifted by a first angle from the direction perpendicular to the surface is defined by first indices, and a second evaluation substrate in which the direction defined by the first indices is inclined by an angle larger than the first angle from a normal direction of a surface of the second evaluation substrate; (b) implanting impurities into the first evaluation substrate by using an ion beam propagating in parallel to the direction defined by the first indices or propagating along a direction shifted by a second angle from the direction defined by the first indices; (c) implanting impurities into the second evaluation substrate by using an ion beam propagating in parallel to the direction defined by the first indices or propagating along a direction shifted by a third angle from the direction defined by the first indices; (d) measuring impurity concentration distributions in a depth direction of the first and second evaluation substrates; and (e) predicting a first impurity concentration distribution on an extension line of the ion beam and a second impurity concentration distribution along a direction perpendicular to the extension line, in accordance with an impurity concentration distribution of the first evaluation substrate and an impurity concentration distribution of the second evaluation substrate, respectively measured by the step (d), wherein: the first and second angles are selected so that there is substantially a negligible difference between an impurity concentration distribution in the depth direction by ion implantation in a vertical direction into a third evaluation substrate in which the direction defined by the first indices is perpendicular to a surface of the third evaluation substrate, and an impurity concentration distribution in the depth direction by ion implantation into the first evaluation substrate at the step (b); and the third angle is selected so that there is substantially a negligible difference between the impurity concentration distributions on the extension line of an ion beam and in a direction perpendicular to the extension line by ion implantation into the second evaluation substrate by the ion beam propagating in a direction parallel to the direction defined by the first indices, and the impurity concentration distributions on the extension line of an ion beam and in a direction perpendicular to the extension line by ion implantation into the second evaluation substrate by the ion beam propagating in a direction shifted by the third angle from the direction defined by the first indices.

BRIEF DESCRIPTION OF THE DRAWINGS

FIG. 5 is a table showing evaluation values of various parameters of a function adopted by an evaluation method of an embodiment.

DETAILED DESCRIPTION OF THE EMBODIMENTS

With reference to FIGS. 1 to 3B, description will be made on a method of evaluating an impurity concentration distribution according to an embodiment. The definitions of the xy orthogonal coordinate system and st orthogonal coordinate system shown in FIG. 1 have already been described, and the description thereof is omitted here.

Figure 1:
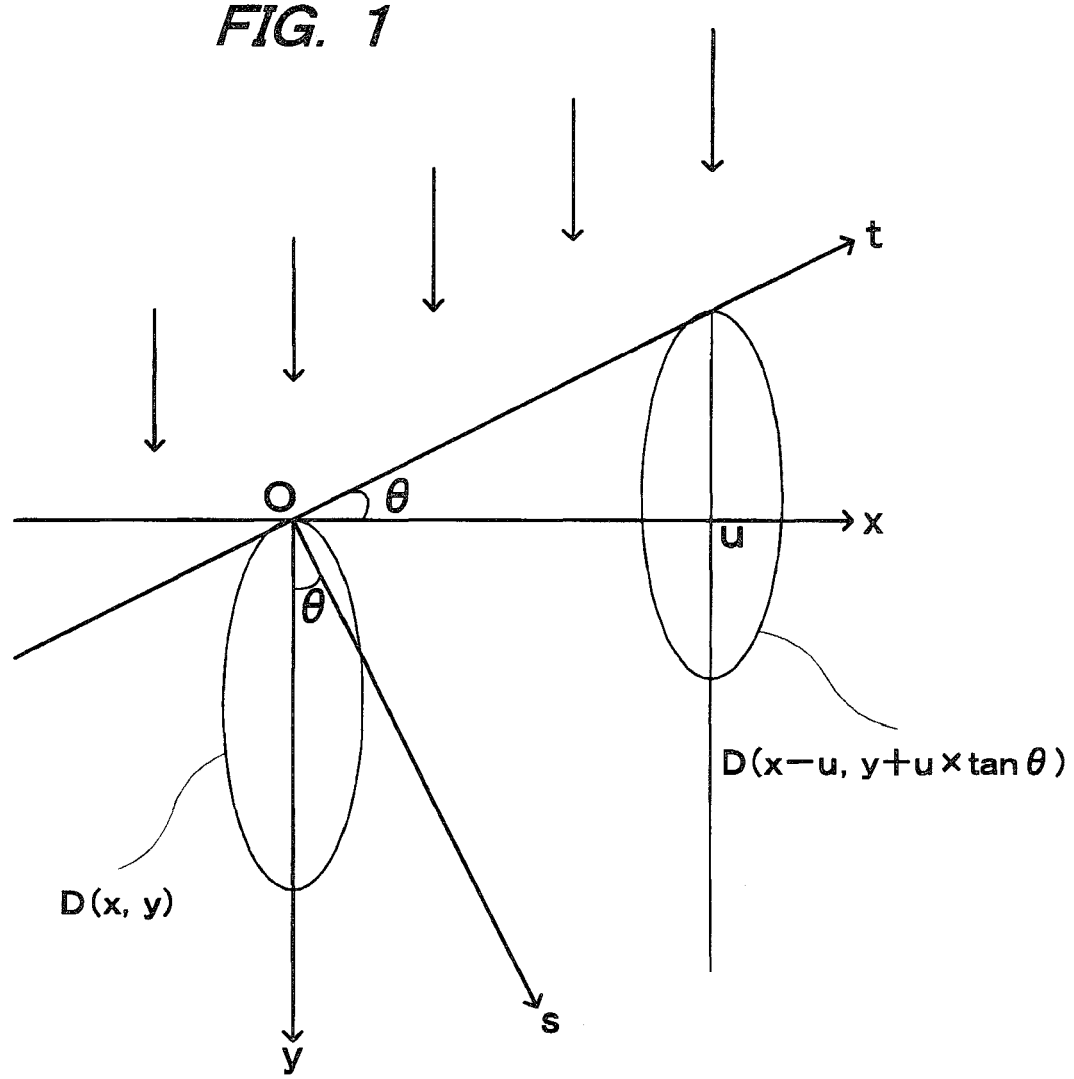
FIG. 1 is a line chart showing the relation among a substrate, an ion beam and coordinate systems.

Consider first the case in which an incidence angle θ of an ion beam shown in FIG. 1 is 0°, i.e., a vertical incidence case.

Figure 2:
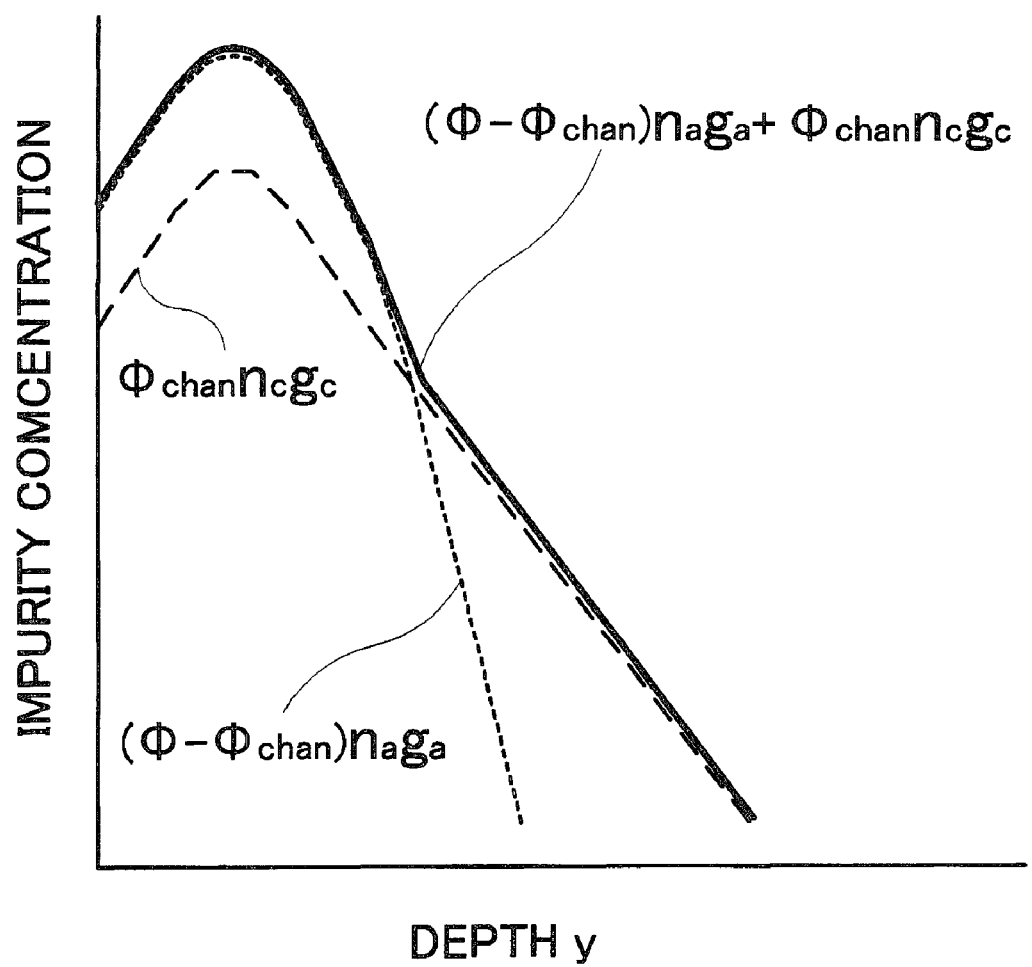
FIG. 2 is a graph showing an example of an impurity concentration distribution in a depth direction.

FIG. 2 shows a typical example of an impurity concentration distribution in a depth direction. It is known that as impurity ions are implanted into a semiconductor substrate, the impurity concentration distribution in a depth direction is represented by a synthesis of an amorphous part and a channeling part. The amorphous part shows an impurity concentration distribution predicted on the assumption that the substrate is amorphous, and the channeling part indicates an impurity concentration distribution of impurities reaching a deeper region by the channeling phenomenon. Referring to FIG. 1, as an ion beam becomes incident upon a position between u and u+du in x-coordinate, an impurity concentration $dN(x, y)$ at a coordinate point $(x, y)$ is expressed by the following formula (11):

$$dN(x,y)=(\Phi-\Phi_{chan})n_a(y)g_a(x-u,y)du+\Phi_{chan}n_c(y)g_c(x-u,y)du$$

where $\Phi$ represents a total dose, and $\Phi_{chan}$ represents a dose of the channeling part. $n_a$ represents a normalized impurity concentration distribution of the amorphous part along an ion beam extension line, and $n_c$ represents a normalized impurity concentration distribution of the channeling part along an ion beam extension line (hereinafter described as "beam axis"). $g_a$ represents a normalized impurity concentration distribution of the amorphous part along a direction (hereinafter described as "lateral direction") perpendicular to the beam axis, and $g_c$ represents a normalized impurity concentration distribution of the channeling part along the lateral direction. The normalized impurity concentration distributions $n_a$ and $n_c$ can be approximated, for example, by the Pearson IV distribution.

If ion implantation is conducted by assuming that the surface area of a semiconductor substrate is infinite and the whole area in a direction of the x-axis is scanned with an ion beam, an impurity concentration $N(x, y)$ at the coordinate point $(x, y)$ is given by the following formula (12):

$$N(x, y) = (\Phi - \Phi_{chan})\int_{-\infty}^{\infty} n_a(y)g_a(x-u, y)du +$$

$$\Phi_{chan}\int_{-\infty}^{\infty} n_c(y)g_c(x-u, y)du$$

$$= (\Phi - \Phi_{chan})n_a(y) + \Phi_{chan}n_c(y)$$

Figure 3A:
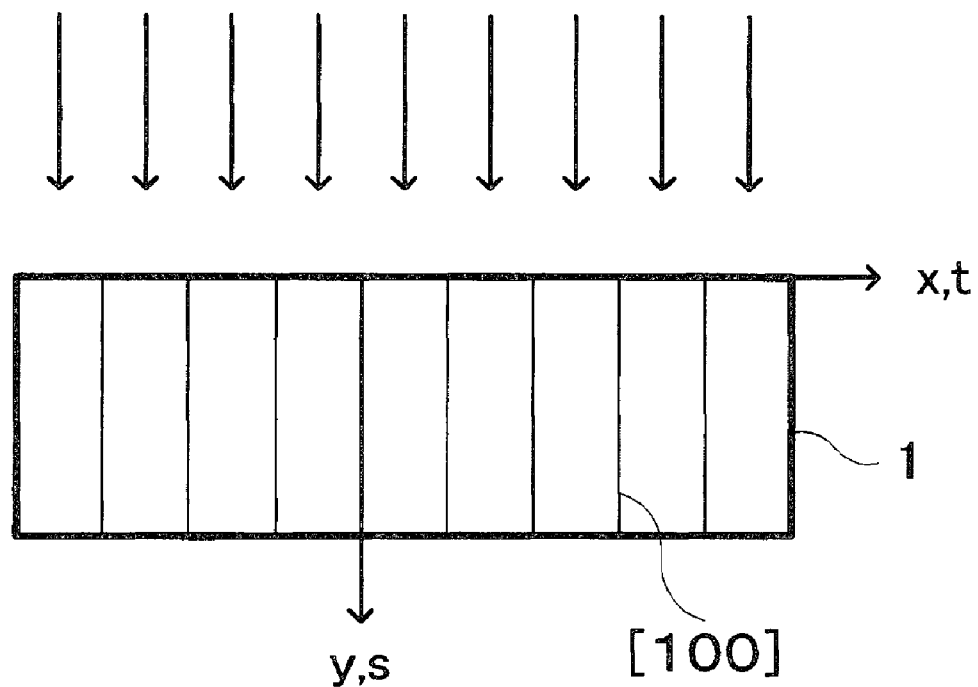
FIGS. 3A and 3B are line charts showing a positional relation between a crystalline axis direction of a substrate subject to ion implantation and a propagation direction of an ion beam.

As shown in FIG. 3A, a first evaluation substrate 1 is prepared which is made of silicon single crystal and exposes the (1 0 0) plane. The [1 0 0] direction of the first evaluation substrate 1 is perpendicular to the surface of the substrate 1. Impurity ions are implanted into the first evaluation substrate 1 by using an ion beam propagating along a direction perpendicular to the surface. In this case, the y-axis and s-axis of the coordinate system shown in FIG. 1 are coincident, and the x-axis and t-axis are coincident. Therefore, by actually measuring the impurity concentration distribution in the depth direction by SIMS or the like, it is possible to decide the normalized impurity concentration distributions $n_a(y)$ and $n_c(y)$ approximated by the Pearson IV distribution, and $\Phi_{chan}/\Phi$.

Figure 3B:
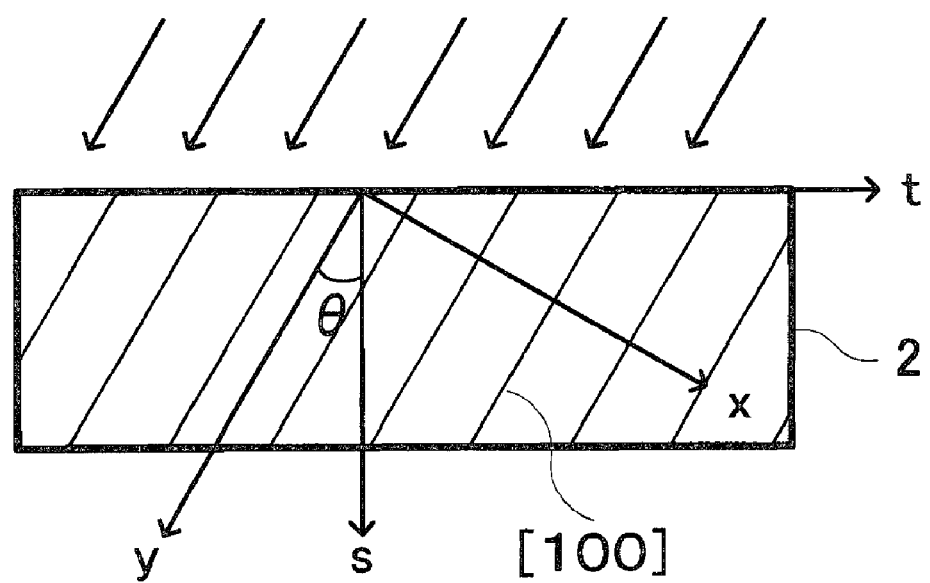

As shown in FIG. 3B, a second evaluation substrate 2 is prepared which is made of silicon single crystal and has the [1 0 0] direction tilted by an angle θ relative to the substrate surface. Impurity ions are implanted into the second evaluation substrate 2 under the condition that the propagation direction of an ion beam is parallel to the [1 0 0] direction of the second evaluation substrate 2. Namely, the y-axis becomes parallel to the [1 0 0] direction. A dose and an acceleration energy are set to the same conditions as those of the ion implantation in the vertical direction shown in FIG. 3A.

The positional relation between the arrangement of crystal lattices of the second evaluation substrate 2 and the propagation direction of an ion beam is the same as the positional relation between the arrangement of crystal lattices of the first evaluation substrate 1 and the propagation direction of an ion beam shown in FIG. 3A. Therefore, as shown in FIG. 3B, even for the ion implantation in an oblique direction, it can be considered that the normalized impurity concentration distributions $n_a(y)$, $g_a(x, y)$, $n_c(y)$ and $g_c(x, y)$ are the same as those for the vertical ion implantation shown in FIG. 3A.

As an ion beam is incident upon a position between u and u+du in x-coordinate, an impurity concentration $dN(x, y)$ at a coordinate point $(x, y)$ is expressed by the following formula (13):

$$dN(x,y)=(\Phi-\Phi_{chan})n_a(y+u\tan\theta)g_a(x-u,y+u\tan\theta)du$$
$$\Phi_{chan}n_c(y+u\tan\theta)g_c(x-u,y+u\tan\theta)du$$

Therefore, an impurity concentration $N(x, y)$ at the coordinate point $(x, y)$ is given by the following formula (14):

$$N(x, y) = (\Phi - \Phi_{chan})\int_{-\infty}^{\infty} n_a(y + u\tan\theta)g_a(x - u, y + u\tan\theta)du +$$

$$\Phi_{chan}\int_{-\infty}^{\infty} n_c(y + u\tan\theta)g_c(x - u, y + u\tan\theta)du$$

The value of the formula (8) may be adopted as the lower limit of an integration range. As the coordinate relation shown by the formula (3) is adopted to the formula (14), the following formula (15) can be obtained:

$$N(s, t) = (\Phi - \Phi_{chan})\int_{-\infty}^{\infty} n_a(s\cos\theta - t\sin\theta + u\tan\theta) \times$$
$$g_a(t\cos\theta + s\sin\theta - u, s\cos\theta - t\sin\theta + u\tan\theta)du +$$

-continued $$\Phi_{chan} \int_{-\infty}^{\infty} n_c(s\cos\theta - t\sin\theta + u\tan\theta) \times$$
$$g_c(t\cos\theta + s\sin\theta - u, s\cos\theta - t\sin\theta + u\tan\theta) \, du$$

Although an impurity concentration distribution N(s, t) depends on the coordinate s, this distribution should not depend on the coordinate t. In order for the variable t not to appear explicitly in the formula (15), the variable k defined by the formula (5) is incorporated. By using the variable k, the formula (15) can be rewritten by the following formula (16):

$$N(s) = (\Phi - \Phi_{chan}) \int_{-\infty}^{\infty} n_a(s\cos\theta + k\tan\theta) g_a(s\sin\theta - k, s\cos\theta + k\tan\theta) dk +$$
$$\Phi_{chan} \int_{-\infty}^{\infty} n_c(s\cos\theta + k\tan\theta) g_c(s\sin\theta - k, s\cos\theta + k\tan\theta) dk$$

An impurity concentration distribution N(s) in the depth direction of the second evaluation substrate 2 doped with impurities is actually measured by SIMS or the like. The normalized impurity concentration distributions $n_a$ and $n_c$, and $\Phi_{chan}/\Phi$ on the beam axis in the formula (16) have already been decided by the process illustrated in FIG. 3A. From the actually measured impurity concentration distribution N(s) and formula (16), the normalized impurity concentration distributions $g_a$ and $g_c$ in the lateral direction can be decided.

As described above, by preparing the first evaluation substrate 1 shown in FIG. 3A and the second evaluation substrate 2 shown in FIG. 3B, the condition under which the normalized impurity concentration distributions $n_a$ and $n_c$ on the beam axis by ion implantation in the vertical direction are identical with those in the oblique direction can be realized. It is therefore possible to decide the normalized impurity concentration distribution in the lateral direction.

In this embodiment, as shown in FIG. 3A, although the [1 0 0] direction of the first evaluation substrate 1 is perpendicular to the substrate surface, the [1 0 0] direction may be tilted by a first angle from the direction perpendicular to the substrate surface, if the condition to be described later is satisfied. Further, although the propagation direction of an ion beam incident upon the first evaluation substrate 1 is parallel to the [1 0 0] direction, the propagation direction of an ion beam may be tilted from the [1 0 0] direction by a second angle if the condition to be described later is satisfied.

Also in this embodiment, although the propagation direction of an ion beam incident upon the second evaluation substrate 2 shown in FIG. 3B is parallel to the [1 0 0] direction of the substrate, the propagation direction of an ion beam may be tilted from the [1 0 0] direction by a third angle if the condition to be described later is satisfied.

Description will be made on the conditions to be satisfied by the first to third angles. The first and second angles are selected so that there is substantially a negligible difference between an impurity concentration distribution in the depth direction by ion implantation in a vertical direction into a third evaluation substrate having the [1 0 0] direction perpendicular to the substrate surface, and an impurity concentration distribution in the depth direction by ion implantation into the first evaluation substrate.

The third angle is selected so that there is substantially a negligible difference between the impurity concentration distributions on the beam axis and in the lateral direction by ion implantation by an ion beam propagating in a direction parallel to the [1 0 0] direction, and the impurity concentration distributions on the beam axis and in the lateral direction by ion implantation by an ion beam propagating in a direction tilted by the third angle from the [1 0 0] direction.

These conditions are satisfied, for example, if the first angle is not larger than 0.5°, the second angle is not larger than 0.50 and the third angle is not larger than 0.50.

In order to retain a sufficient evaluation precision, it is preferable to set an angle made by the [1 0 0] direction of the second evaluation substrate and a direction perpendicular to the substrate surface in range between 0° and 1°.

In this embodiment, ion implantation into a silicon substrate whose [1 0 0] direction is perpendicular to the substrate has been described by way of example. The embodiment is also applicable to other semiconductor crystal substrates or substrates whose direction expressed by other indices is perpendicular to the substrate surface.

Description will be made specifically on a method of evaluating an impurity concentration distribution in the lateral direction, when the impurity concentration distribution on the beam axis is expressed by the function described in the paper "Analytical expression for ion-implanted impurity concentration profiles", by K. Suzuki and R. Sudo, Solid-State Electronics, vol. 44, pp. 2253-2257, 2001. A similar evaluation method can be performed even if the impurity concentration distribution on the beam axis is approximated by a different function. For example, the amorphous part and channeling part may be approximated by the dual Pearson IV distribution expressed by two different Pearson IV distributions.

The normalized impurity concentration distributions $n_a(y)$ and $n_c(y)$ in the formula (11) can be expressed by the following formulas (17):

$$n_a(y) = h_{ma}(y)$$
$$n_c(y) = \begin{cases} h_{mc}(y) & (y < y_T) \\ \kappa\{h_{mc}(y) + h_{TC}(y)\} & (y > y_T) \end{cases}$$

The functions $h_{ma}$ and $h_{mc}$ are the Pearson distributions. Although both have the same moment, normalizing factors are different. As boron (B) is implanted at a high energy, the impurity concentration distribution shows two peaks in some cases. In order for the approximation to be applied also to the distribution having two peaks, different parameters Rp and Rp2 are used as the project ranges of the functions $h_{ma}$ and $h_{mc}$. Generally, approximation at a sufficient high precision can be made even if it is assumed that Rp=Rp2.

If the standard deviation in the propagation direction of an ion beam is $\Delta$Rp, $y_T$ is Rp2+$\Delta$Rp. The Pearson IV distributions $h_{ma}$ and $h_{mc}$ can be identified by five parameters Rp, Rp2, $\Delta$Rp, $\gamma$ and $\beta$. If it is assumed that Rp=Rp2, the Pearson IV distributions can be identified by four parameters.

The coefficient $\kappa$ is introduced to maintain continuity of the functions at $y=y_T$. The following formula (18) is adopted as a function $h_{TC}(y)$ by introducing a parameter $\eta$:

$$h_{TC}(y) = h_{mc}(y_p)\exp\left\{-(\ln\eta)\left[\frac{y - y_p}{L}\right]^\alpha\right\}$$

$y_p$ is a depth at which an impurity concentration is maximum. A parameter L represents a depth of channeling, and an index $\alpha$ represents a shape of a distribution of the channeling part. More specifically, a value of a normalized impurity concentration distribution $n_c(y)$ at a depth of $y_p+L$ is approximately equal to a value of the normalized impurity concentration distribution at a depth $y_p$, i.e., $(\kappa/\eta)$ times as large as $h_{mc}(y_p)$. Is $\alpha=1$, the function $h_{TC}$ is an exponential function. In a graph having a depth as an abscissa and an impurity concentration in a logarithmic scale as an ordinate, the function is represented by a straight line which slants to the right. If $\alpha>1$, the function is represented by a curve swelling upward from the straight line, and if $\alpha<1$, the function is represented by a curve swelling downward from the straight line.

It is assumed that the normalized impurity concentration distributions $g_a(x, y)$ and $g_c(x, y)$ in the lateral direction are approximated by normal distributions. Assuming that the standard deviation is dependent upon the depth y, the normalized impurity concentration distributions $g_a$ and $g_c$ can be expressed by the following formulas (19):

$$g_a(x, y) = \frac{1}{\sqrt{2\pi}\,\Delta R_{pta}(y)} \exp\left[-\frac{x^2}{2\Delta R_{pta}^2(y)}\right]$$

$$g_c(x, y) = \frac{1}{\sqrt{2\pi}\,\Delta R_{ptc}(y)} \exp\left[-\frac{x^2}{2\Delta R_{ptc}^2(y)}\right]$$

The standard deviations $\Delta R_{pta}$ and $\Delta R_{ptc}$ are defined as (20):

$$\Delta R_{pta} = \begin{cases} \Delta R_{pt0} + m_f(y - y_p) & (y < y_p) \\ \Delta R_{pt0} + m_{ba}(y - y_p) & (y > y_p) \end{cases}$$

$$\Delta R_{ptc} = \begin{cases} \Delta R_{pt0} + m_f(y - y_p) & (y < y_p) \\ \Delta R_{pt0} + m_{bc}(y - y_p) & (y > y_p) \end{cases}$$

$\Delta R_{pt0}$ corresponds to the standard deviation at the position where an impurity concentration is maximum. Parameter $m_f$ corresponds to inclinations of $\Delta R_{pta}$ and $\Delta R_{ptc}$ in the region shallower than the position where an impurity concentration is maximum. Parameters $m_{ba}$ and $m_{bc}$ correspond to inclinations of $\Delta R_{pta}$ and $\Delta R_{ptc}$ respectively, in the region deeper than the position where an impurity concentration is maximum.

Parameters for identifying the normalized impurity concentration distributions $n_a(y)$ and $n_c(y)$ on the beam axis given by the formulas (17) can be decided from the actual measurement results of the impurity concentration distribution in the depth direction by ion implantation in the vertical direction shown in FIG. 3A. Parameters for identifying the normalized impurity concentration distributions $g_a(x, y)$ and $g_c(x, y)$ in the lateral direction given by the formulas (19) can be decided from the actual measurement results N(s) of the impurity concentration distribution in the depth direction by ion implantation in the oblique direction shown in FIG. 3B and from the formula (16).

Figure 4:
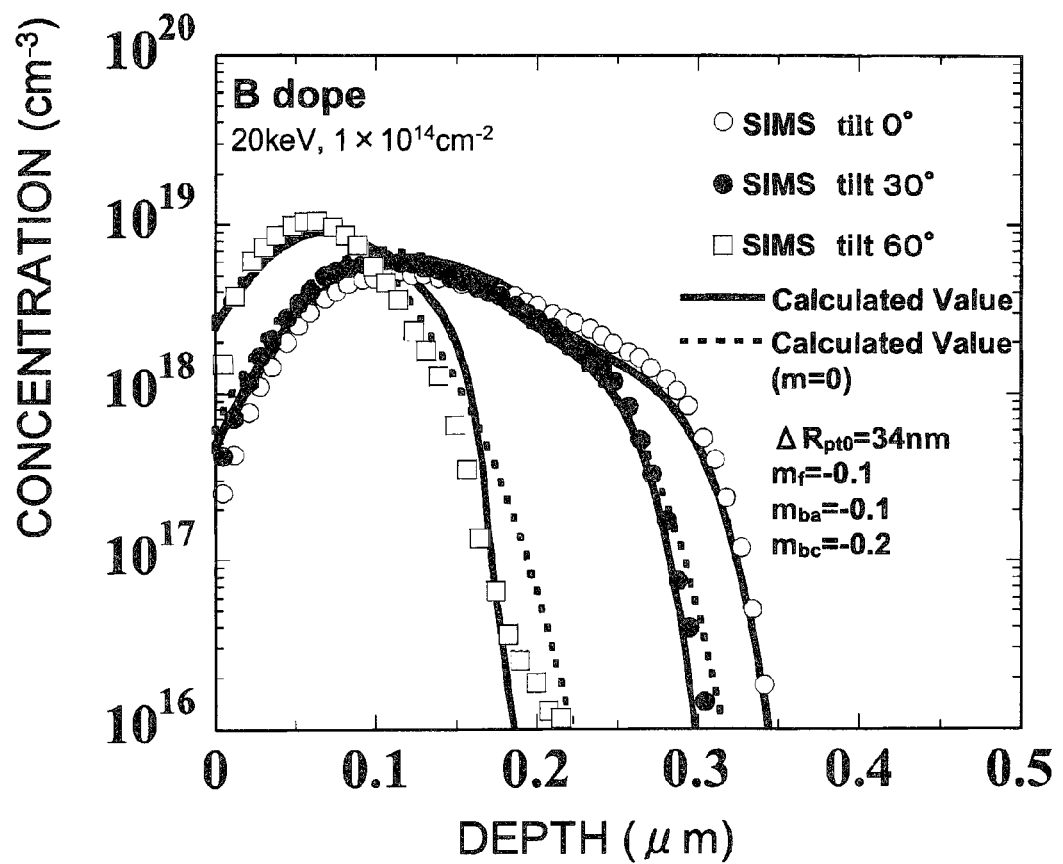
FIG. 4 is a graph showing comparison between measured values and calculated values of an impurity concentration distribution.

FIG. 4 shows actually measured results of the impurity concentration distribution in the depth direction, in comparison with the impurity concentration distribution in the depth direction calculated from the formula (16) by deciding parameters of the normalized impurity concentration distribution so as to match the actually measured results. The abscissa of FIG. 4 represents a depth in the unit of "µm", and the ordinate represents an impurity concentration in the unit of "$cm^{-3}$". Doped impurities were boron (B), an acceleration energy was set to 20 keV, and a dose $\Phi$ was set to $1\times10^{14}$ $cm^{-2}$.

In FIG. 4, a white circle symbol, a black circle symbol and a square symbol indicate the measurement results at ion beam incidence angles $\theta$ of 0°, 30° and 60°, respectively. The five parameters of the Pearson IV distributions $h_{ma}$ and $h_{mc}$ shown in the formulas (17), channeling dose $\Phi_{chan}$, the parameters $\eta$, L and $\alpha$ identifying the function $h_{TC}$ shown in the formula (18) were decided so that the measurement values at the incidence angle $\theta$ of 0° matched the impurity concentration distribution N(x, y) shown in the formula (12). At the parameters Rp of 98 nm, Rp2 of 176 nm, $\Delta$Rp of 38 nm, $\gamma$ of –0.3, and $\beta$ of 3.2 of the Pearson IV distribution, and at the parameters $\eta$ of 1000, L of 175 nm and $\alpha$ of 5 of the function $h_{TC}$, the calculated values well matched the actually measured values as indicated by a solid line shown in FIG. 4.

Next, the parameters $\Delta R_{pt0}$, $m_f$, $m_{ba}$ and $m_{bc}$ of the normalized impurity concentration distributions $g_a$ and $g_c$ were decided so that the measurement values of the impurity concentration distribution at the incidence angle $\theta$ of 300 matched the impurity concentration distribution N(s) shown in the formula (16). The calculated values indicated by a solid line shown in FIG. 4 were obtained at $\Delta R_{pt0}$ of 34 nm, $m_f$ of –0.1, $m_{ba}$ of –0.1, and $m_{bc}$ of –0.2. It could be seen that the calculated values well matched the actually measured values.

For reference, calculated results at $m_f=m_{ba}=m_{bc}=0$ are indicated by a broken line. Condition $m_f=m_{ba}=m_{bc}=0$ means that the standard deviation of a lateral spread does not depend on a depth.

As described above, impurity distribution information not only in the depth direction but also in the lateral direction can be obtained by actually measuring the impurity concentration distributions in the depth direction at the ion beam incidence angles $\theta$ of 0° and 30°.

By using the obtained parameters, the impurity concentration distributions at the incidence angle $\theta$ of 60° were calculated. The calculation results well matched the actually measured values. For reference, the calculation results at $m_f=m_{ba}=m_{bc}=0$ are indicated by a broken line.

Ion implantation was performed and the impurity concentration distributions were evaluated at ion implantation acceleration energies of 40 keV, 80 keV and 160 keV, and at ion beam incidence angles $\theta$ of 0°, 30° and 60° at each acceleration energy.

FIG. 5 shows the values of various parameters decided from these actually measured values. It can be seen that as the acceleration energy is raised, $\Delta R_{pt0}$ becomes large. This means that as the acceleration energy is raised, the degree of variation in the impurity concentration distributions in the lateral direction becomes large.

Next, description will be made on a method for evaluating the degree of invasion of impurities just below a gate electrode when ions are implanted into the source and drain regions of a MOS transistor.

Figure 6:
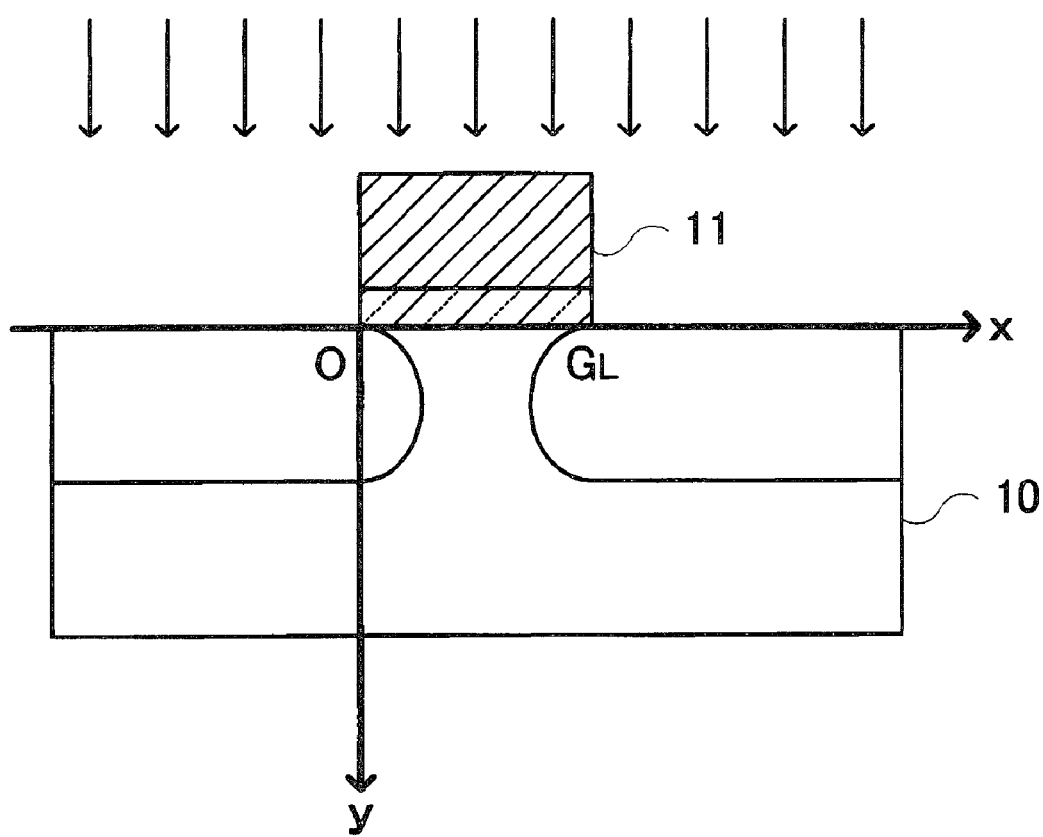
FIG. 6 is a line chart illustrating the relation between a MOS transistor and a coordinate system.

As shown in FIG. 6, the surface of a semiconductor substrate 10 has a gate electrode 11 formed thereon. An xy orthogonal coordinate system is defined having as a y-axis the depth direction of the semiconductor substrate and as an x-axis the gate length direction (a carrier moving direction in a channel). One edge of the gate electrode 11 is used as an origin, and the positive sense of the x-axis looks toward the channel. A gate length is represented by $G_L$.

The normalized impurity concentration distributions $n_a$, $n_c$, $g_a$ and $g_c$ shown in the formula (11) are decided by the impurity concentration distribution evaluating method described with reference to FIGS. 1 to 3B. By integrating the right-hand side of the formula (11) from $-\infty$ to 0 and from $G_L$ to $+\infty$ in respect to a variable $\bar{u}$, an impurity concentration at the coordinate point (x, y) can be obtained.

Next, description will be made on a computer program which executes the impurity concentration distribution evaluating method of the embodiment.

Figure 7A:
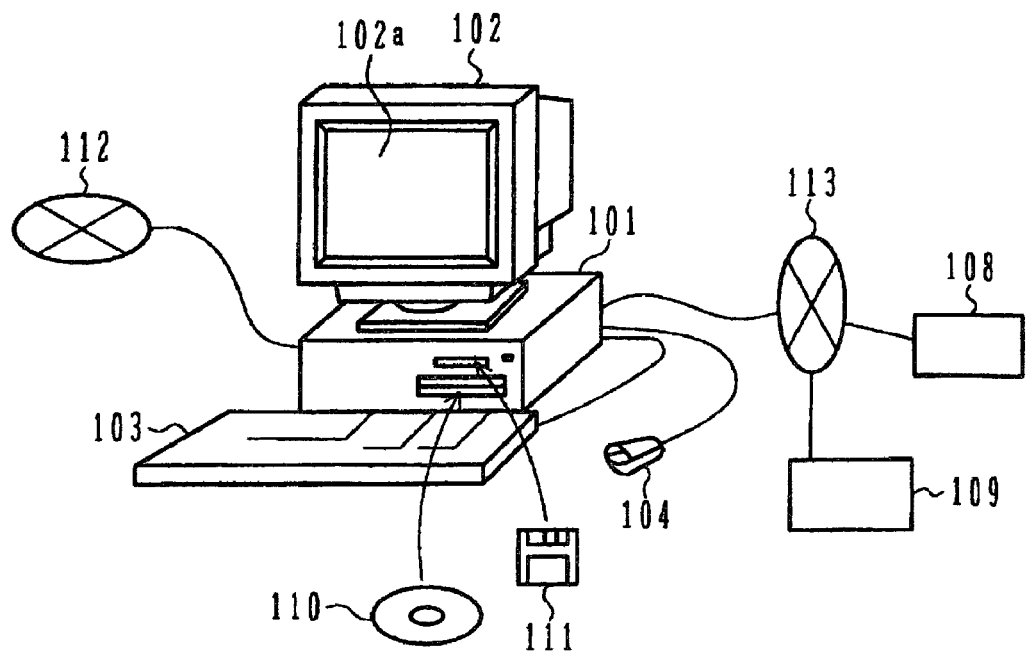
FIG. 7A is a schematic perspective view of a computer system.
Figure 7B:
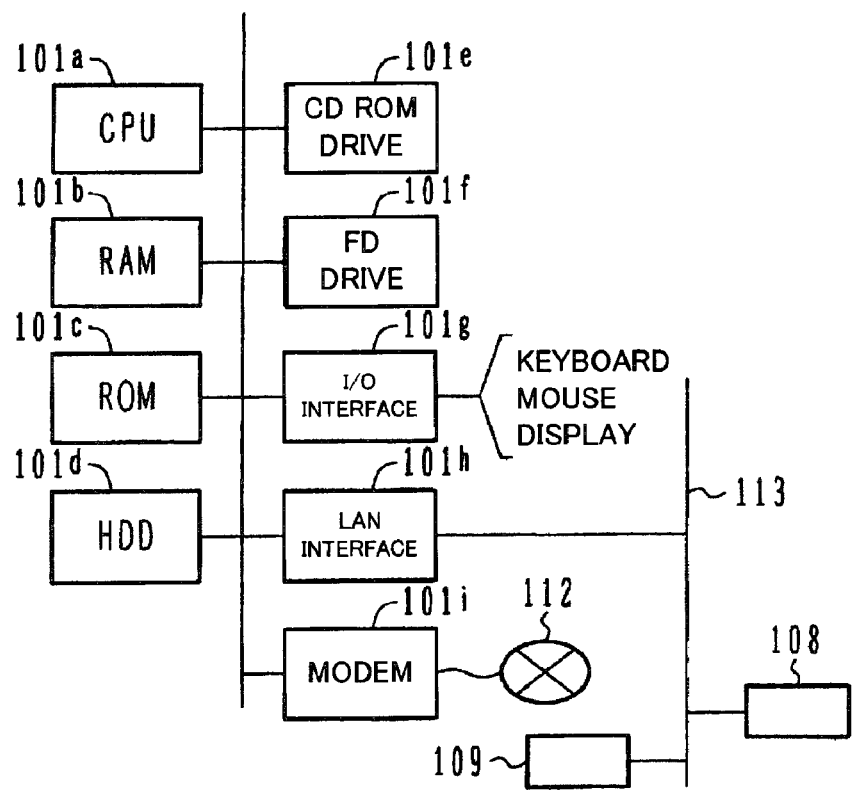
FIG. 7B is a block diagram of a main portion of the computer system.

FIG. 7A is a schematic perspective view of a compute system, and FIG. 7B is a block diagram of the main portion of the computer system.

As shown in FIG. 7B, a CPU 101a, a RAM 101b, a ROM 101c, a hard disk drive 101d, a CD-ROM drive 101e, a floppy disk drive 101f, an I/O interface 101g, a LAN interface 101h, and a modem 101i are built in the main portion 101 shown in FIG. 7A. A display 102, a keyboard 103 and a mouse 104 are connected to the I/O interface 101g. The computer system is connected to a LAN 113 via the LAN interface 101h, and further to a public line 112 via the modem 101i.

In response to an instruction from the main portion 101, information such as images are displayed on a display screen 102a of the display 102. Various information is input to the computer system from the keyboard 103. The mouse 104 designates an arbitrary position on the display screen 102a. The computer system is connected to a database system 108 and another computer system 109 via LAN or public line.

A computer program recorded in a portable recording medium such as a CD-ROM 110 and a floppy disk 111 is installed in the computer system via the CD-ROM drive 101e or floppy disk drive 101f. The portable recording medium includes a DVD disk, an optical magnetic disk, an IC card and the like.

A computer program stored in a recording medium in the database 108, computer system 109 or the like connected to LAN or the like is installed in the computer system via LAN or the like.

The installed computer program is stored in the hard disk drive 101d, and executed by CPU 101a by using RAM 101b or the like.

The program installed in the computer system executes a sequence of inputting from the keyboard or the like the impurity concentration distribution actually measured by ion implantation into the first evaluation substrate 1 shown in FIG. 3A. Next, the program executes a sequence of inputting from the keyboard or the like the impurity concentration distribution actually measured by ion implantation into the second evaluation substrate 2 shown in FIG. 3B.

Thereafter, in accordance with the input actually measured values of the impurity concentration distributions, the program executes a sequence of deciding a first impurity concentration distribution on the extension line of an ion beam and a second impurity concentration distribution in a direction crossing the extension line of the ion beam. This decision is made by deciding the parameters of various functions by the method described in the embodiment. The decided first and second impurity concentration distributions are displayed on the display screen 102a.

Next, as described with reference to FIG. 6, the program executes a sequence of inputting the range of ion implantation. In accordance with the input range, the program executes a sequence of calculating an impurity concentration distribution expanded laterally to the range outside ion implantation. The calculated impurity concentration distribution is displayed on the display screen 102a.

The present invention has been described in connection with the preferred embodiment. The invention is not limited only to the above embodiment. It will be apparent to those skilled in the art that other various modifications, improvements, combinations, and the like can be made.

What is claimed is:

1. A method of predicting an impurity concentration distribution comprising:

preparing a first evaluation substrate made of a single crystal, an angle between a direction perpendicular to a surface of the first evaluation substrate and a direction defined by first Miller indices of the first evaluation substrate being equal to or smaller than a first angle, and a second evaluation substrate made of a same single crystal as the first evaluation substrate, the direction defined by the first Miller indices of the second evaluation substrate being inclined by an angle larger than the first angle from a normal direction of a surface of the second evaluation substrate;

implanting impurities into the first evaluation substrate by using an ion beam propagating in a first direction, an angle between the first direction and the direction defined by the first Miller indices of the first evaluation substrate being equal to or smaller than a second angle;

implanting impurities into the second evaluation substrate by using an ion beam propagating in a second direction, an angle between the second direction and the direction defined by the first Miller indices of the second evaluation substrate being equal to or smaller than a third angle;

measuring impurity concentration distributions in a depth direction of the first and second evaluation substrates into which the impurities are implanted; and predicting a first impurity concentration distribution on an extension line of the ion beam and a second impurity concentration distribution in a direction perpendicular to the extension line by using a computer, in accordance with an impurity concentration distribution of the first evaluation substrate and an impurity concentration distribution of the second evaluation substrate, respectively being measured, wherein:

the first and second angles are selected so that there is substantially a negligible difference between a third impurity concentration distribution and a fourth impurity concentration distribution, the third impurity concentration distribution being an impurity distribution in a depth direction of a third evaluation substrate that is made of a same single crystal as the first evaluation substrate, into which an impurity is implanted in a vertical direction, a direction defined by the first Miller indices of the third evaluation substrate being perpendicular to a surface of the third evaluation substrate, the fourth impurity concentration distribution being an impurity distribution in a depth direction of the first evaluation substrate into which the impurities are implanted; and the third angle is selected so that there is substantially a negligible difference between a fifth impurity concentration distributions and a sixth impurity concentration distributions, the fifth impurity concentration distributions being impurity concentration distributions of the second evaluation substrate when an impurity is implanted using ion beam propagating in a direction parallel to the direction defined by the first Miller indices of the second evaluation substrate, the fifth impurity concentration distributions being a distribution on an extension line of the ion beam and a distribution in a direction perpendicular to the extension line, the sixth impurity concentration distributions being impurity concentration distributions of the second evaluation substrate when an impurity is implanted using ion beam propagating in a direction tilted by the third angle from the direction defined by the first Miller indices of the second evaluation substrate, the sixth impurity concentration distributions being a distribution on an extension line of the ion beam and a distribution in a direction perpendicular to the extension line.

2. The method of predicting an impurity concentration distribution according to claim 1, wherein the predicting includes:
deciding the first impurity concentration distribution from the measured values of the impurity concentration distribution of the first evaluation substrate; and
deciding the second impurity concentration distribution from the measured values of the impurity concentration distribution of the second evaluation substrate and the first impurity concentration distribution being decided.

3. The method of predicting an impurity concentration distribution according to claim 1, further comprising predicting an impurity concentration distribution just below a gate electrode when impurities are implanted into source and drain regions by using the gate electrode as a mask, in accordance with the first and second impurity concentration distributions being predicted.

4. The method of predicting an impurity concentration distribution according to claim 2, further comprising predicting an impurity concentration distribution just below a gate electrode when impurities are implanted into source and drain regions by using the gate electrode as a mask, in accordance with the first and second impurity concentration distributions being predicted.

5. A computer-readable storage device storing a computer program, the computer program executed by a computer, performing the steps of:
inputting measured values of an impurity concentration distribution in a depth direction of a first evaluation sample which is formed by implanting impurities using an ion beam into a first evaluation substrate made of a single crystal, an angle between a direction defined by first Miller indices of the first evaluation substrate and a direction perpendicular to a surface of the first evaluation substrate being equal to or smaller than a first angle, the ion beam propagating in a first direction, an angle between the first direction and a direction defined by the first Miller indices of the first evaluation substrate being equal to or smaller than a second angle, wherein the first and second angles are selected so that there is substantially a negligible difference between an impurity concentration distribution in the depth direction by ion implantation in a vertical direction into a third evaluation substrate that is made of a same single crystal as the first evaluation substrate, in which the direction defined by the first Miller indices of the third evaluation substrate is perpendicular to a surface of the third evaluation substrate, and an impurity concentration distribution in the depth direction of the first evaluation sample;
inputting measured values of an impurity concentration distribution in a depth direction of a second evaluation sample which is formed by implanting impurities using an ion beam into a second evaluation substrate made of a same single crystal as the first evaluation substrate, a direction defined by the first Miller indices of the second evaluation substrate being tilted by an angle larger than the first angle from a normal direction of a surface of the second evaluation substrate, the ion beam propagating in a second direction, an angle between the second direction and the direction defined by the first Miller indices of the second evaluation substrate being equal to or smaller than a third angle, wherein the third angle is selected so that there is substantially a negligible difference between the impurity concentration distributions on the extension line of the ion beam and in a direction perpendicular to the extension line by ion implantation into the second evaluation substrate by the ion beam propagating in a direction parallel to the direction defined by the first Miller indices of the second evaluation substrate, and the impurity concentration distributions on the extension line of the ion beam and in a direction perpendicular to the extension line by ion implantation into the second evaluation substrate by the ion beam propagating in a direction tilted by the third angle from the direction defined by the first Miller indices of the second evaluation substrate; and
deciding a first impurity concentration distribution on the extension line of the ion beam and a second impurity concentration distribution in a direction crossing the extension line of the ion beam, from the measured values being input.

6. The computer-readable storage device storing the computer program according to claim 5, wherein the deciding includes:
deciding the first impurity concentration distribution from the measured values of the impurity concentration distribution of the first evaluation sample; and
deciding the second impurity concentration distribution from the measured values of the impurity concentration distribution of the second evaluation sample and the first impurity concentration distribution being decided.

7. The computer-readable storage device storing the computer program according to claim 5 further causing to computer to execute:
inputting a range of ion implantation in a surface layer of a substrate; and
calculating an impurity concentration distribution expanded laterally outside the ion implantation range, in accordance with the first and second impurity concentration distributions decided in the deciding and the ion implantation range being input.

8. The computer-readable storage device storing the computer program according to claim 6 further causing to computer to execute:
inputting a range of ion implantation in a surface layer of a substrate; and
calculating an impurity concentration distribution expanded laterally outside the ion implantation range, in accordance with the first and second impurity concentration distributions decided in the deciding and the ion implantation range being input.

9. A computer for executing steps of:
inputting measured values of an impurity concentration distribution in a depth direction of a first evaluation sample which is formed by implanting impurities using an ion beam into a first evaluation substrate made of a single crystal, an angle between a direction defined by first Miller indices of the first evaluation substrate and a direction perpendicular to a surface of the first evaluation substrate being equal to or smaller than a first angle, the ion beam propagating in a first direction, an angle between the first direction and a direction defined by the first Miller indices of the first evaluation substrate being equal to or smaller than a second angle, wherein the first and second angles are selected so that there is substantially a negligible difference between an impurity concentration distribution in the depth direction by ion implantation in a vertical direction into a third evaluation substrate that is made of a same single crystal as the first evaluation substrate, in which the direction defined by the first Miller indices of the third evaluation substrate is perpendicular to a surface of the third evaluation substrate, and an impurity concentration distribution in the depth direction of the first evaluation sample;

inputting measured values of an impurity concentration distribution in a depth direction of a second evaluation sample which is formed by implanting impurities using an ion beam into a second evaluation substrate made of a same single crystal as the first evaluation substrate, a direction defined by the first Miller indices of the second evaluation substrate being tilted by an angle larger than the first angle from a normal direction of a surface of the second evaluation substrate, the ion beam propagating in a second direction, an angle between the second direction and the direction defined by the first Miller indices of the second evaluation substrate being equal to or smaller than a third angle, wherein the third angle is selected so that there is substantially a negligible difference between the impurity concentration distributions on the extension line of the ion beam and in a direction perpendicular to the extension line by ion implantation into the second evaluation substrate by the ion beam propagating in a direction parallel to the direction defined by the first Miller indices of the second evaluation substrate, and the impurity concentration distributions on the extension line of the ion beam and in a direction perpendicular to the extension line by ion implantation into the second evaluation substrate by the ion beam propagating in a direction tilted by the third angle from the direction defined by the first Miller indices of the second evaluation substrate; and deciding a first impurity concentration distribution on the extension line of the ion beam and a second impurity concentration distribution in a direction crossing the extension line of the ion beam, from the measured values being input.

10. The computer according to claim 9, wherein the deciding includes:

deciding the first impurity concentration distribution from the measured values of the impurity concentration distribution of the first evaluation sample; and deciding the second impurity concentration distribution from the measured values of the impurity concentration distribution of the second evaluation sample and the first impurity concentration distribution being decided.

11. The computer according to claim 9 further executing steps of:

inputting a range of ion implantation in a surface layer of a substrate; and calculating an impurity concentration distribution expanded laterally outside the ion implantation range, in accordance with the first and second impurity concentration distributions being decided and the ion implantation range being input.

12. The computer according to claim 10 further executing steps of:

inputting a range of ion implantation in a surface layer of a substrate; and calculating an impurity concentration distribution expanded laterally outside the ion implantation range, in accordance with the first and second impurity concentration distributions being decided and the ion implantation range being input.

* * * * *